US009666438B2

(12) United States Patent
Lin et al.

(10) Patent No.: US 9,666,438 B2
(45) Date of Patent: May 30, 2017

(54) SEMICONDUCTOR DEVICE AND FORMATION THEREOF

(71) Applicant: Taiwan Semiconductor Manufacturing Company Limited, Hsin-Chu (TW)

(72) Inventors: Yu-Hung Lin, Taichung (TW); Chih-Wei Chang, Hsin-Chu (TW); Sheng-Hsuan Lin, Zhubei (TW); You-Hua Chou, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/204,004

(22) Filed: Jul. 7, 2016

(65) Prior Publication Data

US 2016/0314979 A1    Oct. 27, 2016

Related U.S. Application Data

(62) Division of application No. 14/200,247, filed on Mar. 7, 2014, now Pat. No. 9,397,040.

(51) Int. Cl.
*H01L 21/285* (2006.01)
*H01L 21/768* (2006.01)
(Continued)

(52) U.S. Cl.
CPC .. *H01L 21/28518* (2013.01); *H01L 21/31111* (2013.01); *H01L 21/76805* (2013.01);
(Continued)

(58) Field of Classification Search
CPC combination set(s) only.
See application file for complete search history.

(56) References Cited

U.S. PATENT DOCUMENTS

| 8,153,520 B1 | 4/2012 | Chandrashekar et al. |
| 2005/0142765 A1 | 6/2005 | Joo |

(Continued)

FOREIGN PATENT DOCUMENTS

TW    200947559    11/2009

OTHER PUBLICATIONS

Corresponding Taiwan Application, Taiwan Office action dated Dec. 24, 2015, 9 pages.

*Primary Examiner* — Mamadou Diallo
(74) *Attorney, Agent, or Firm* — Cooper Legal Group, LLC

(57) ABSTRACT

A semiconductor device and method of formation are provided. The semiconductor device comprises a metal plug in a first opening over a substrate. The metal plug has a contact bottom surface that is substantially convex. The substantially convex contact bottom surface has an increased contact area as compared to a contact bottom surface of a metal plug that is not substantially convex. The increased contact area decreases a resistance of the metal plug. The increased contact area requires a smaller deposition amount to form a metal plug seed layer of the metal plug than a semiconductor device with a smaller contact area. A smaller deposition amount reduces an overhang of the deposited metal plug seed layer material. A reduced overhang of the deposited metal plug seed layer material reduces pitting in a metal plug formed from the deposited metal plug seed layer material.

20 Claims, 5 Drawing Sheets

(51) Int. Cl.
*H01L 23/522* (2006.01)
*H01L 23/532* (2006.01)
*H01L 23/485* (2006.01)
*H01L 21/311* (2006.01)

(52) U.S. Cl.
CPC .. *H01L 21/76843* (2013.01); *H01L 21/76855* (2013.01); *H01L 21/76879* (2013.01); *H01L 21/76883* (2013.01); *H01L 21/76897* (2013.01); *H01L 23/485* (2013.01); *H01L 23/5226* (2013.01); *H01L 23/53266* (2013.01); *H01L 2924/0002* (2013.01)

(56) References Cited

U.S. PATENT DOCUMENTS

| | | |
|---|---|---|
| 2005/0169041 A1 | 8/2005 | Wang |
| 2007/0020975 A1* | 1/2007 | Chung .............. H01L 21/76814 439/125 |
| 2008/0079090 A1 | 4/2008 | Hwang et al. |
| 2009/0004850 A1 | 1/2009 | Ganguli et al. |
| 2009/0087981 A1 | 4/2009 | Suzuki et al. |
| 2013/0244385 A1* | 9/2013 | Saitoh ............... H01L 29/66666 438/270 |

* cited by examiner

SEMICONDUCTOR DEVICE AND FORMATION THEREOF

RELATED APPLICATION

This application is a divisional of and claims priority to U.S. patent application Ser. No. 14/200,247, originally titled "SEMICONDUCTOR DEVICE AND FORMATION THEREOF" and filed on Mar. 7, 2014, which is incorporated herein by reference.

BACKGROUND

Contacts are used to make electrical connections in or among different features in a semiconductor arrangement. A contact, for example, is used to connect one of a source or a drain to a metal layer, where the source and the drain are otherwise electrically isolated from the metal layer, such as by an insulating or dielectric material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
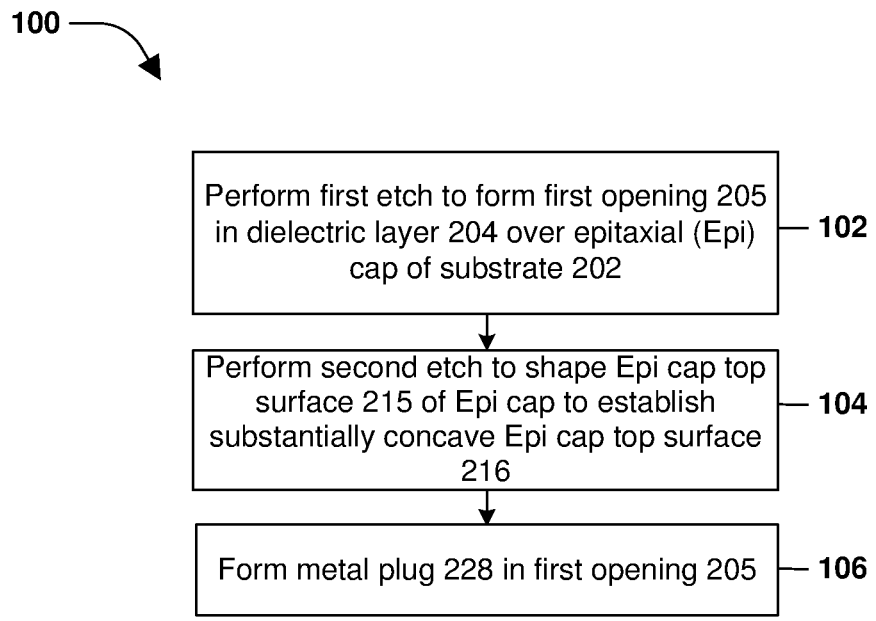
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 6:
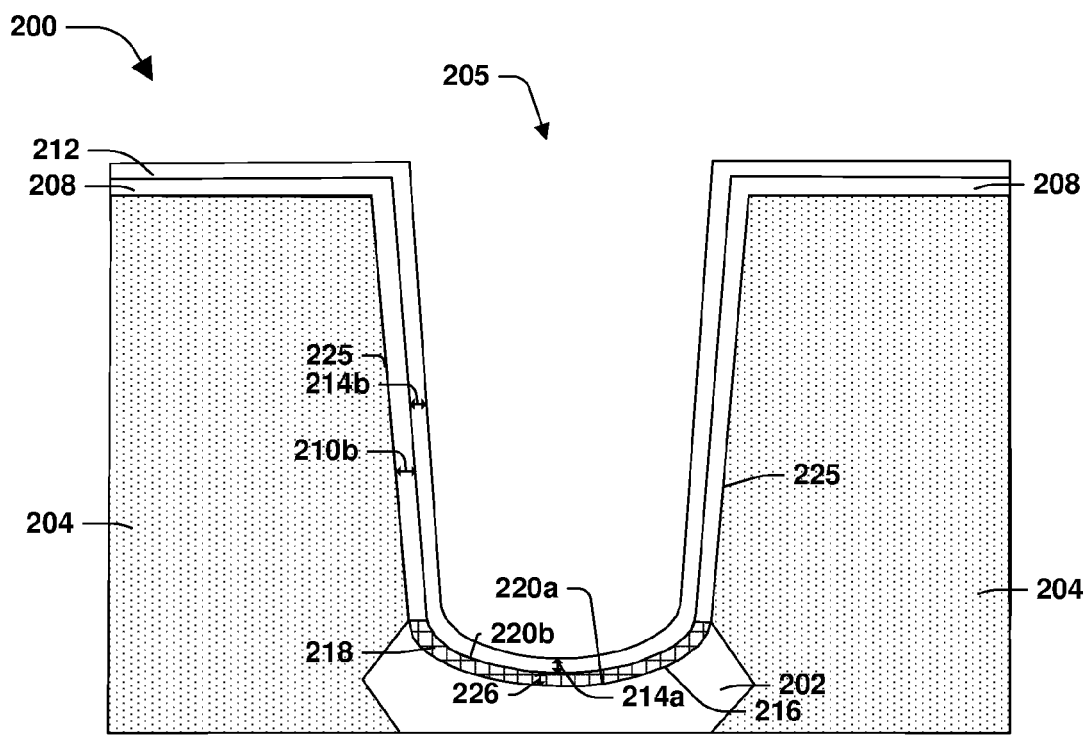
FIG. 6 is an illustration of a semiconductor device, in accordance with some embodiments.
Figure 7:
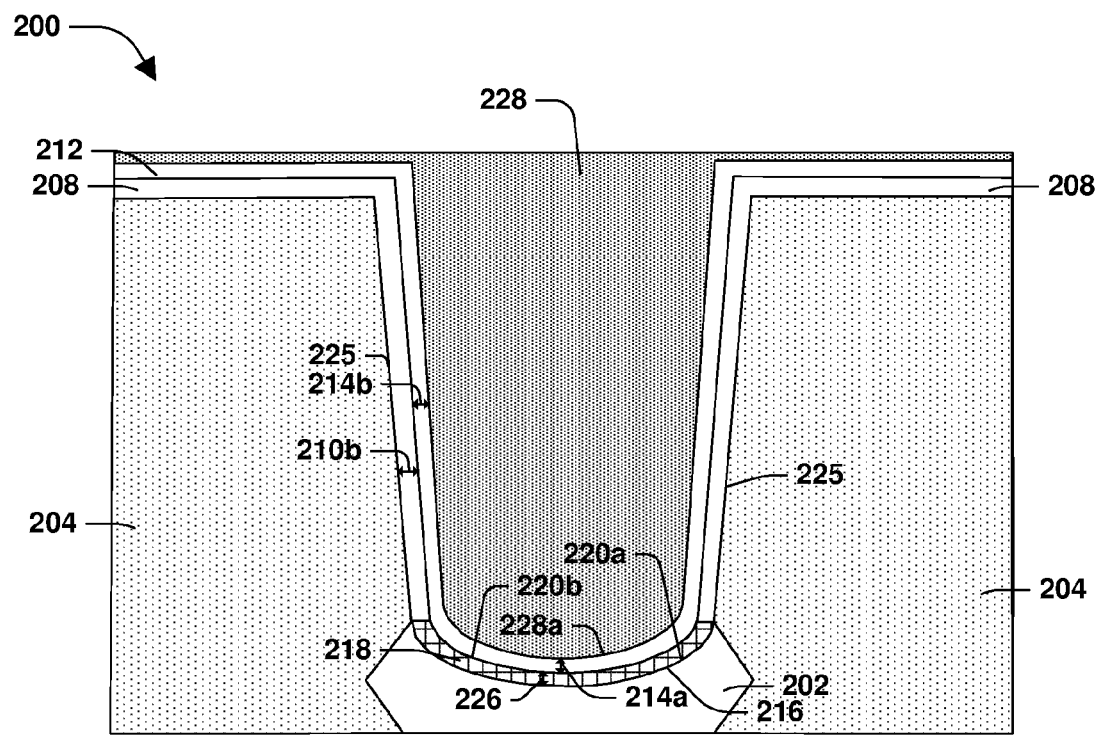
FIG. 7 is an illustration of a semiconductor device, in accordance with some embodiments.
Figure 8:
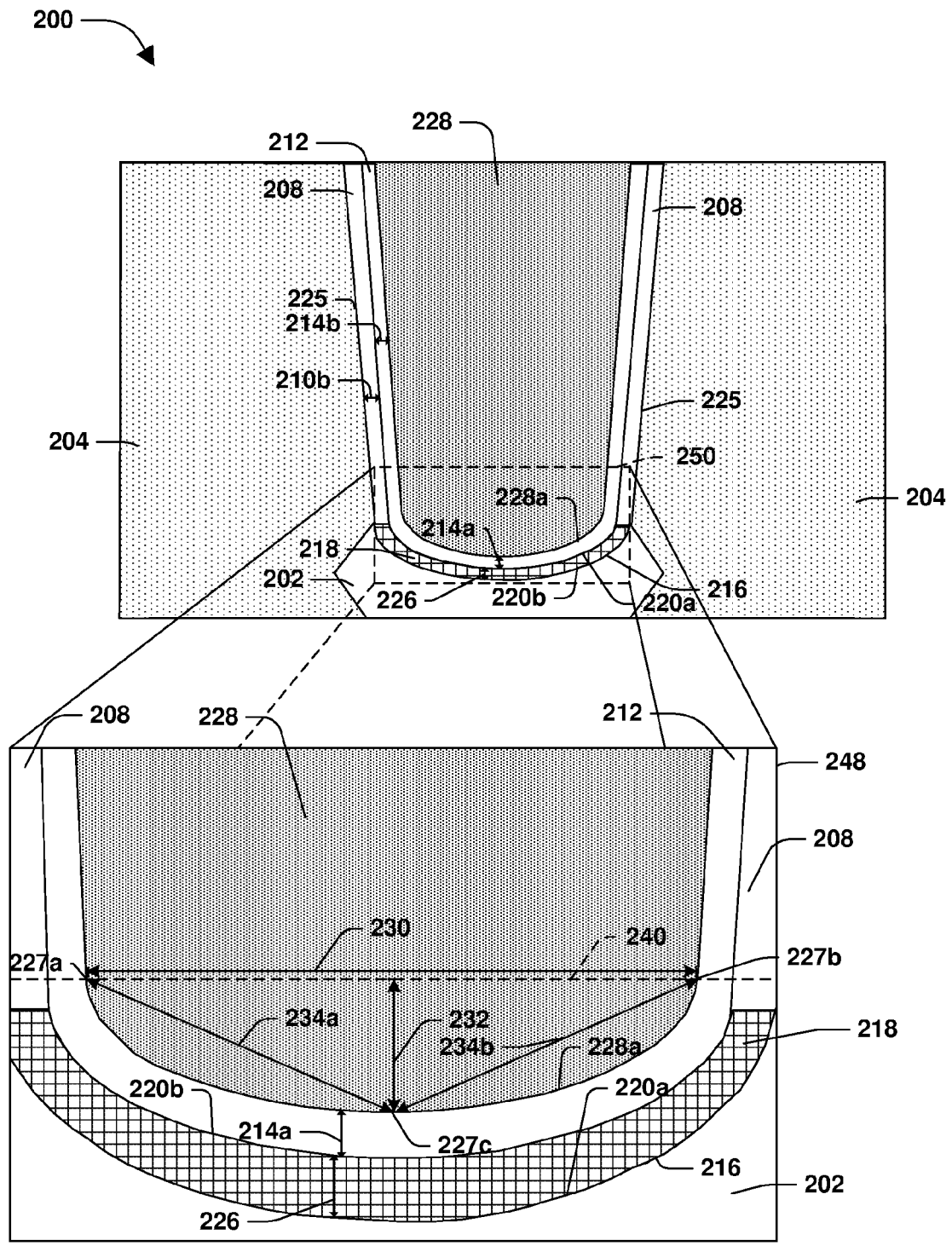
FIG. 8 is an illustration of a semiconductor device, in accordance with some embodiments.

A method 100 of forming a semiconductor device 200 according to some embodiments is illustrated in FIG. 1 and one or more structures formed thereby at various stages of fabrication are illustrated in FIGS. 2-8. According to some embodiments, such as illustrated in FIG. 8, the semiconductor device 200 comprises a metal plug 228 in a first opening 205, illustrated in FIG. 6, defined by a dielectric layer 204 over a substrate 202. In some embodiments, the metal plug 228 is over a silicide layer 218, where the silicide layer 218 is between the metal plug 228 and the substrate 202. According to some embodiments, a box 248 illustrates zoomed in or magnified portions of the metal plug 228, a first metal layer 208, a second metal layer 212, the silicide layer 218 and the substrate 202 encompassed by a dashed box 250. In some embodiments, the metal plug 228 has a contact bottom surface 228a that is substantially convex. In some embodiments, the silicide layer 218 has a silicide layer top surface 220b that is substantially concave to interface with the substantially convex contact bottom surface 228a or the second metal layer 212. In some embodiments, the silicide layer 218 has a silicide layer bottom surface 220a that is substantially convex to interface with a substantially concave epitaxial (Epi) top surface 216 of an Epi cap comprised within the substrate 202. In some embodiments, the contact bottom surface 228a has a first distal location 227a, a second distal location 227b and an apex 227c. In some embodiments, the first distal location 227a and the second distal location 227b lie within a plane 240. In some embodiments, the first distal location 227a and the second distal location 227b are separated a distal distance 230 from one another. In some embodiments, the apex 227c is a location on the contact bottom surface 228a that is farthest from the plane 240. In some embodiments, the apex 227c is separated an apex distance 232 from the plane 240, where the apex distance 232 is measured at a substantially 90° angle from the plane 240. In some embodiments, the apex 227c is substantially equidistant from the first distal location 227a and the second distal location 227b such that a first distance 234a between the first distal location 227a and the apex 227c is substantially equal to a second distance 234b between the second distal location 227b and the apex 227c. In some embodiments, the apex distance 232 is about 0.2 to about 2.5 times the distal distance 230. In some embodiments, the substantially convex contact bottom surface 228a has an increased contact area as compared to a contact bottom surface of a metal plug that is not substantially convex. In some embodiments, an increased contact area decreases a resistance of the contact. In some embodiments, the increased contact area requires a smaller deposition amount to form a metal plug seed layer of the metal plug 228 than a semiconductor device with a smaller contact area. In some embodiments, a smaller deposition amount reduces an overhang of the deposited metal plug seed layer material. In some embodiments, a reduced overhang of the deposited metal plug seed layer material reduces pitting in a metal plug formed from the deposited metal plug seed layer material.

Figure 2:
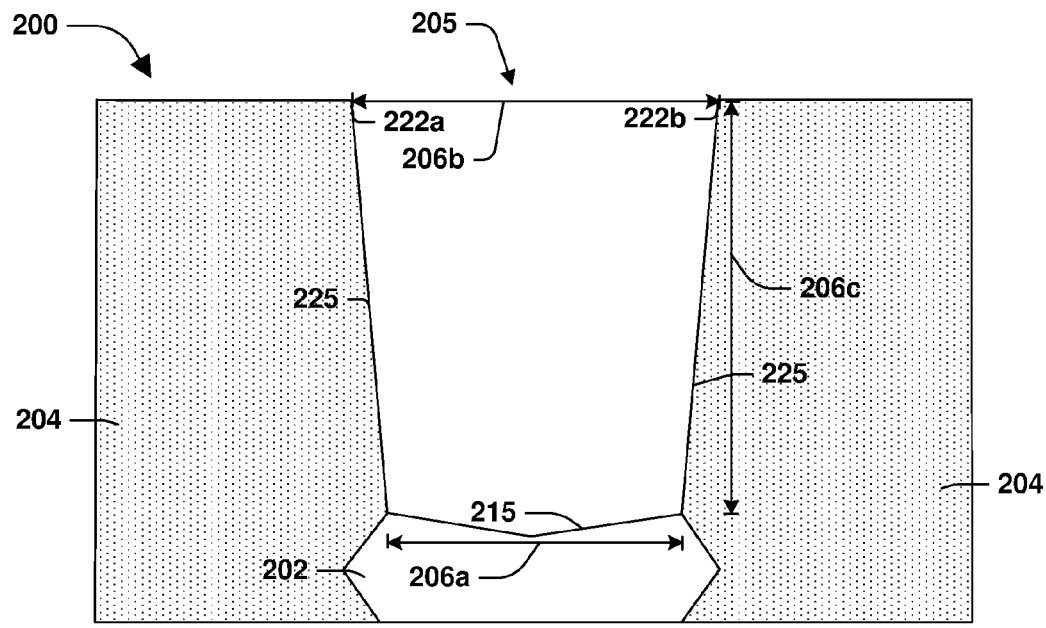
FIG. 2 is an illustration of a semiconductor device, in accordance with some embodiments.

At 102, as illustrated in FIG. 2, a first etch is performed to form the first opening 205 defined by the dielectric layer 204 over the substrate 202, according to some embodiments. In some embodiments, the substrate 202 comprises at least one of silicon, phosphorus, carbon, or germanium. According to some embodiments, the substrate 202 comprises at least one of an epitaxial layer or cap, a silicon-on-insulator (SOI) structure, a wafer, or a die formed from a wafer. In some embodiments, the substrate 202 comprises the Epi cap. In some embodiments, the dielectric layer 204 comprises at least one of a silicon oxide or a silicon nitride. In some embodiments, the first opening 205 has a top width 206b. In some embodiments, the top width 206b is measured from top portions of opposing top sidewalls 222a and 222b of sidewalls 225 defining the first opening 205. In some embodiments, the top width 206b is about 10 µm to about 250m. In some embodiments, the first opening 205 has a bottom width 206a. In some embodiments, the bottom width 206a is about 5 µm to about 220m. In some embodiments, the top width 206b is greater than the bottom width 206a. In some embodiments, the first opening 205 has a first depth 206c as measured from a top surface of the dielectric layer 204 to a top surface of the substrate 202. In some embodiments, the first depth 206c is about 750 Å to about 1,250 Å. In some embodiments, the first etch comprises introducing a first gas comprising at least one of $CF_4$, $CH_2F_2$, $CHF_3$, $CH_3F$, $C_2F_6$ or $CH_3Br$ into a chamber, within which the semiconductor device 200 is formed, at a first flow rate of about 5 sccm to about 500 scccm. In some embodiments, the first etch comprises introducing a second gas comprising at least one of $H_2$ or $O_2$ into the chamber at a second flow rate of about 2 sccm to about 100 scccm. In some embodiments, the first etch is performed at a first temperature of about 5° C. to about 200° C. In some embodiments, the first etch is performed at a first pressure of about 5 mTorr to about 900 mTorr. In some embodiments, the first etch is performed using a first power of about 30 W to about 3000 W.

Figure 3:
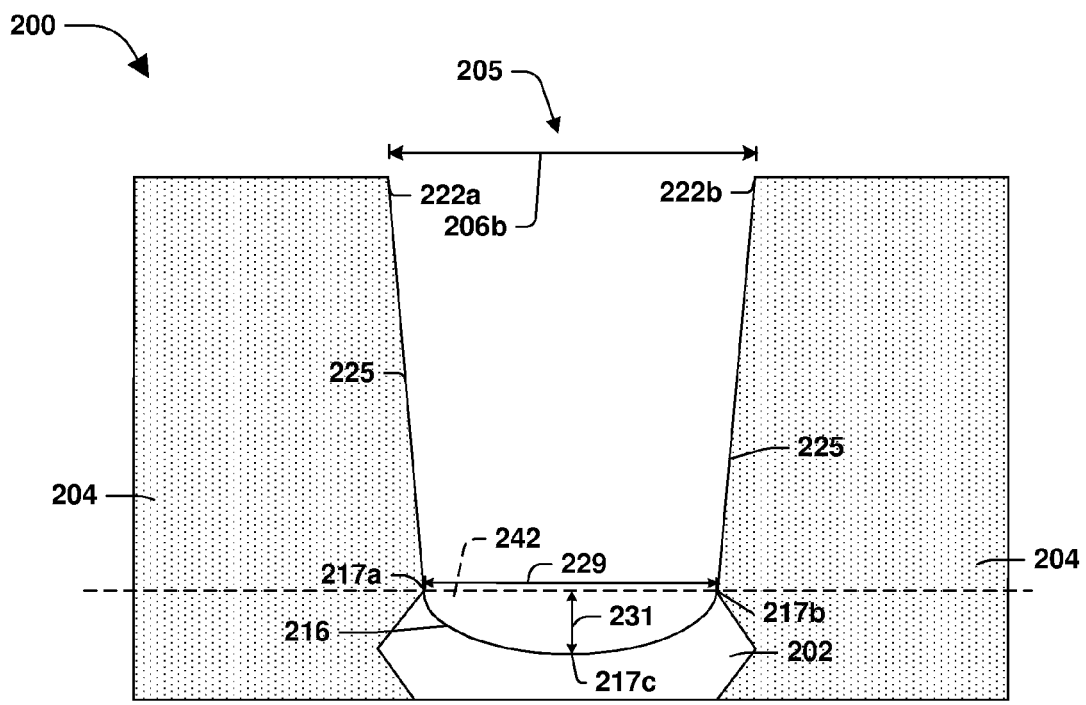
FIG. 3 is an illustration of a semiconductor device, in accordance with some embodiments.

At 104, as illustrated in FIG. 3, a second etch is performed to shape an Epi cap top surface 215 of the Epi cap to establish the substantially concave Epi top surface 216, according to some embodiments. In some embodiments, the second etch is performed by introducing a first etching gas comprising at least one of $H_2SiCl_2$, $SiH_4$, HCl or $Cl_2$ into the chamber. In some embodiments, the second etch is performed at a first etching temperature of about 700° C. to about 1050° C. In some embodiments, the second etch is performed at a first etching pressure of about 300 Torr to about 700 Torr. In some embodiments, the second etch is performed by performing a sputter on the Epi cap top surface 215 using a first sputter power of about 25 W to about 300 W. In some embodiments, the second etch is performed by performing the sputter on the Epi cap top surface 215 at a first sputter pressure of about 0.1 mTorr to about 20 mTorr. In some embodiments, the second etch is performed by introducing a first sputter gas comprising argon into the chamber at a first sputter flow rate of about 5 sccm to about 500 sccm. In some embodiments, the substantially concave Epi cap top surface 216 has a first distal Epi location 217a, a second distal Epi location 217b and an Epi apex 217c. In some embodiments, the first distal Epi location 217a and the second distal Epi location 217b lie within an Epi plane 242. In some embodiments, the first distal Epi location 217a and the second distal Epi location 217b are separated a distal Epi distance 229 from one another. In some embodiments, the Epi apex 217c is a location on the substantially concave Epi top surface 216 that is farthest from the Epi plane 242. In some embodiments, the Epi apex 217c is separated an Epi apex distance 231 from the Epi plane 242, where the Epi apex distance 231 is measured at a substantially 90° angle from the Epi plane 242. In some embodiments, the Epi apex distance 231 is about 0.2 to about 2.5 times the distal Epi distance 229.

Figure 4:
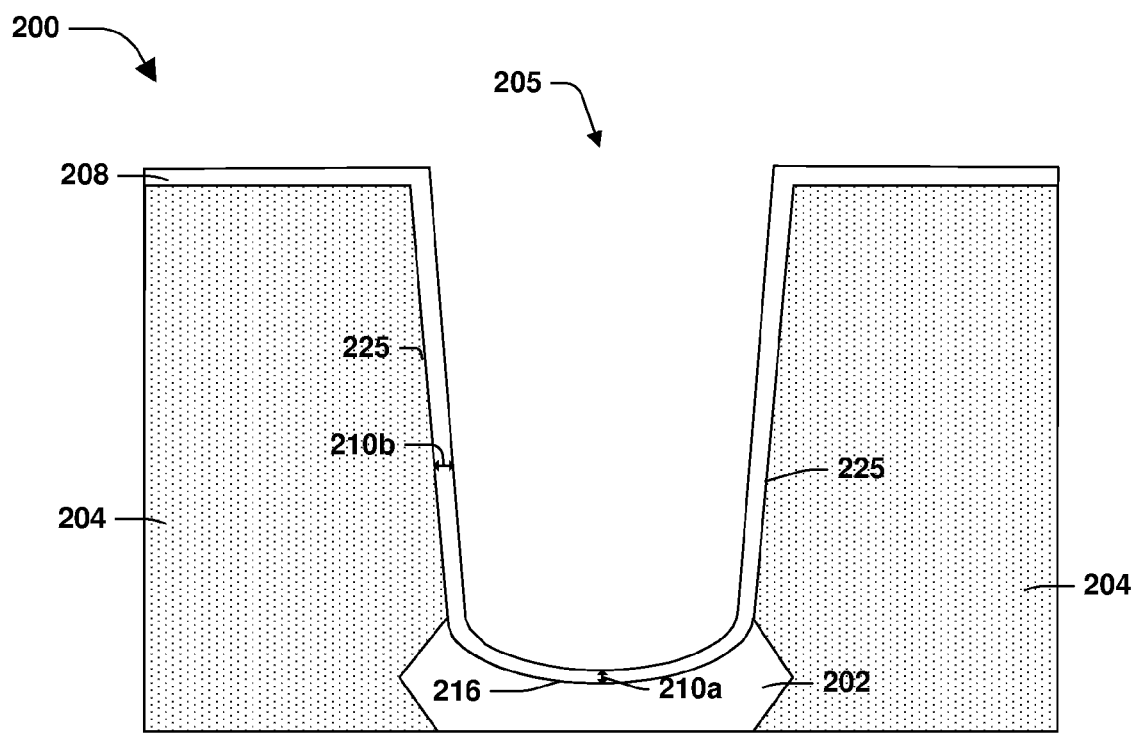
FIG. 4 is an illustration of a semiconductor device, in accordance with some embodiments.

Turning to FIG. 4, the first metal layer 208 is formed in the first opening 205 defined by the dielectric layer 204 over the substrate 202, according to some embodiments. In some embodiments, the first metal layer 208 comprises at least one of nickel, cobalt or titanium. In some embodiments, the first metal layer 208 has a first bottom thickness 210a about 5 Å to about 300 Å. In some embodiments, the first metal layer 208 has a first sidewall thickness 210b about 2 Å to about 100 Å. In some embodiments, the first bottom thickness 210a is greater than the first sidewall thickness 210b. In some embodiments, the first metal layer 208 is formed using at least one of physical vapor deposition (PVD) or atomic layer deposition (ALD).

Figure 5:
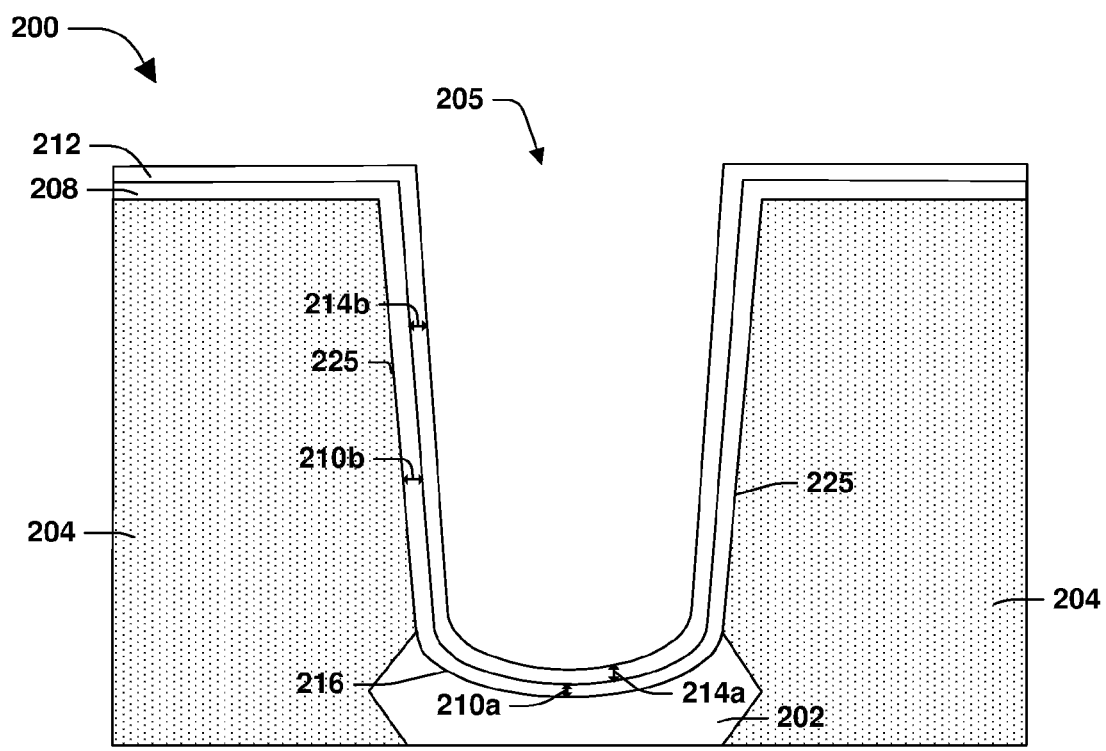
FIG. 5 is an illustration of a semiconductor device, in accordance with some embodiments.

Turning to FIG. 5, the second metal layer 212 is formed over the first metal layer 208 in the first opening 205, according to some embodiments. In some embodiments, the second metal layer 212 comprises at least one of titanium (Ti), nitride (N) or titanium nitride (TiN). In some embodiments, the second metal layer 212 has a second bottom thickness 214a about 5 Å to about 150 Å. In some embodiments, the second metal layer 212 has a second sidewall thickness 214b about 2 Å to about 125 Å. In some embodiments, the second bottom thickness 214a is greater than the second sidewall thickness 214b. In some embodiments, the second metal layer 212 is formed by at least one of PVD, chemical vapor deposition (CVD) or ALD.

Turning to FIG. 6, an anneal is performed on the semiconductor device 200 to form the silicide layer 218 over substrate 202 from the first metal layer 208, according to some embodiments. In some embodiments, the first metal layer 208, the second metal layer 212 and the substrate 202 are at least one of annealed at a first annealing temperature of about 400° C. to about 800° C. or annealed for a first annealing duration of about 5 s to about 2 hours. In some embodiments, the first metal layer 208 remains on the sidewall 225 of the first opening 205 defined by the dielectric layer 204. In some embodiments, the silicide layer 218 has a silicide thickness 226 about 5 Å to about 150 Å. In some embodiments, the silicide layer 218 comprises silicon and at least one of nickel, cobalt, or titanium. In some embodiments, the silicon in the silicide layer 218 migrates from the silicon in the substrate 202. In some embodiments, the silicide layer bottom surface 220a of the silicide layer 218 is substantially convex to interface with the substantially concave Epi top surface 216 of the Epi cap comprised within the substrate 202.

At 106, as illustrated in FIG. 8, the metal plug 228 is formed in the first opening 205 over the second metal layer 212, according to some embodiments. Turning to FIG. 7, prior to FIG. 8, a metal plug seed layer (not shown) is formed over the second metal layer 212 in the first opening 205, according to some embodiments. In some embodiments, the metal plug seed layer is formed by ALD. In some embodiments, the metal plug seed layer comprises tungsten. In some embodiments, a metal plug composite (not shown) is formed over the metal plug seed layer to form the metal plug 228. In some embodiments, the metal plug composite comprises tungsten. In some embodiments, at least one of the metal plug seed layer or the metal plug composite is formed by introducing a plug gas comprising at least one of $B_2H_6$, $H_2$ or $SiH_4$ and a metal plug precursor comprising $WF_6$ into the chamber. In some embodiments, at least one of the metal plug seed layer or the metal plug composite is formed at a plug temperature of about 300° C. to about 450° C. In some embodiments, at least one of the metal plug seed layer or the metal plug composite is formed at a plug pressure of about 350 Torr to about 500 Torr.

Turning to FIG. 8, at least one of the first metal layer 208 or the second metal layer 212 are removed from the top surface of the dielectric layer 204 by chemical mechanical planarization (CMP), to expose the top surface of the dielectric layer 204. In some embodiments, residual portions of the metal plug 228, such as residual portions of the metal plug 228 above the top surface of the dielectric layer 204, are removed. In some embodiments, residual portions of the metal plug 228 are removed from the top surface of the dielectric layer 204 by CMP. According to some embodiments, the box 248 illustrates zoomed in or magnified portions of the metal plug 228, the first metal layer 208, the second metal layer 212, the silicide layer 218 and the substrate 202 encompassed by the dashed box 250. In some embodiments, the contact bottom surface 228a of the metal plug 228 is substantially convex. In some embodiments, the silicide layer top surface 220b is substantially concave to interface with the substantially convex contact bottom surface 228a or the second metal layer 212. In some embodiments, the silicide layer bottom surface 220a is substantially convex to interface with the substantially concave Epi top surface 216 of the Epi cap comprised within the substrate 202. In some embodiments, the substantially convex contact bottom surface 228a has the first distal location 227a, the second distal location 227b and the apex 227c. In some embodiments, the first distal location 227a and the second distal location 227b lie within the plane 240. In some embodiments, the first distal location 227a and the second distal location 227b are separated the distal distance 230 from one another. In some embodiments, the apex 227c is the location on the substantially convex contact bottom surface 228a that is farthest from the plane 240. In some embodiments, the apex 227c is separated the apex distance 232 from the plane 240, where the apex distance 232 is measured at a substantially 90° angle from the plane 240. In some embodiments, the apex 227c is substantially equidistant from the first distal location 227a and the second distal location 227b such that the first distance 234a between the first distal location 227a and the apex 227c is substantially equal to the second distance 234b between the second distal location 227b and the apex 227c. In some embodiments, the apex distance 232 is about 0.2 to about 2.5 times the distal distance 230. In some embodiments, the substantially convex contact bottom surface 228a has an increased contact area as compared to a contact bottom surface of a metal plug that is not substantially convex. In some embodiments, increased contact area of a metal plug decreases a resistance of the metal plug. In some embodiments, the increased contact area requires a smaller deposition amount to form a metal plug seed layer than a semiconductor device with a smaller contact area. In some embodiments, a smaller deposition amount reduces an overhang of a deposited metal plug seed layer material. In some embodiments, a reduced overhang of the deposited metal plug seed layer material reduces pitting in a metal plug formed from the deposited metal plug seed layer material.

According to some embodiments, a semiconductor device comprises a metal plug in a first opening defined by a dielectric layer over a substrate. In some embodiments, the metal plug has a contact bottom surface that is substantially convex. In some embodiments, a silicide layer is between the substrate and the metal plug. In some embodiments, the silicide layer has a silicide layer top surface that is substantially concave to interface with the substantially convex contact bottom surface of the metal plug.

According to some embodiments, a method of forming a semiconductor device comprises performing a first etch to form a first opening in a dielectric layer over an epitaxial (Epi) cap of a substrate, performing a second etch to shape an Epi cap top surface of the Epi cap to establish a substantially concave Epi top surface and forming a metal plug in the first opening. In some embodiments forming the metal plug comprises forming a metal plug seed layer in the first opening and forming a metal plug composite over the metal plug seed layer.

According to some embodiments, a semiconductor device comprises a metal plug in a first opening defined by a dielectric layer, the metal plug having a contact bottom surface that is substantially convex. In some embodiments, a silicide layer is under the metal plug, the silicide layer having a silicide layer top surface that is substantially concave to interface with the substantially convex contact bottom surface of the metal plug. In some embodiments, an epitaxial (Epi) cap has a substantially concave Epi top surface to interface with a substantially convex silicide layer bottom surface of the silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
    performing a first etch on a dielectric layer overlying an epitaxial (Epi) cap to form an opening;
    performing a second etch on the Epi cap to establish a substantially concave Epi top surface on the Epi cap;
    forming a first metal layer over the substantially concave Epi top surface;
    forming a second metal layer over the first metal layer; and
    performing an anneal operation on the first metal layer, the second metal layer and Epi cap to form a silicide layer in contact with the substantially concave Epi top surface and having a silicide layer top surface that is substantially concave, wherein at least some of the first metal layer contacts an edge of the silicide layer after the anneal operation.

2. The method of claim 1, comprising:
    forming a metal plug in the opening after the anneal operation, wherein the metal plug overlies the second metal layer and the silicide layer.

3. The method of claim 2, the forming a metal plug comprising:
    forming a metal plug seed layer in the opening over the second metal layer; and
    forming a metal plug composite in the opening over the metal plug seed layer.

4. The method of claim 3, wherein the metal plug seed layer is formed by atomic layer deposition (ALD) and the metal plug composite is formed by chemical vapor deposition (CVD).

5. The method of claim 1, wherein the first metal layer comprises at least one of nickel, cobalt, or titanium and the second metal layer comprises titanium nitride.

6. The method of claim 1, comprising increasing a temperature within a chamber in which the first etch and the second etch are performed between the first etch and the second etch.

7. The method of claim 6, wherein the first etch is performed at a temperature of about 5° C. to about 200° C. and the second etch is performed at a temperature of about 700° C. to about 1050° C.

8. The method of claim 1, wherein the second etch comprises a sputtering process.

9. A method of forming a semiconductor device, comprising:
    performing a first etch on a dielectric layer and an epitaxial (Epi) cap underlying the dielectric layer to form an opening;
    performing a second etch on the Epi cap to reshape a top surface of the Epi cap that defines a bottom of the opening;
    lining the opening with a first metal layer after the second etch; and
    performing an anneal operation, wherein during the anneal operation silicon migrates from the Epi cap to the first metal layer to form a silicide layer from a first portion of the first metal layer.

10. The method of claim 9, wherein a width of the opening at a top surface of the dielectric layer is greater than a width of the opening at the top surface of the Epi cap after the first etch.

11. The method of claim 9, wherein the top surface of the Epi cap is v-shaped after the first etch and is concave after the second etch.

12. The method of claim 9, wherein the first metal layer comprises at least one of nickel, cobalt, or titanium.

13. The method of claim 9, comprising:
    lining the opening with a second metal layer prior to performing the anneal operation, wherein the second metal layer overlies the first metal layer.

14. The method of claim 13, wherein the second metal layer comprises titanium nitride.

15. The method of claim 13, comprising:
    forming a metal plug in the opening after the anneal operation, the metal plug overlying the silicide layer and the second metal layer.

16. The method of claim 9, wherein a second portion of the first metal layer contacts an edge of the silicide layer after the anneal operation.

17. The method of claim 9, comprising:
    forming a metal plug in the opening after the anneal operation, the metal plug overlying the silicide layer.

18. A method of forming a semiconductor device, comprising:
    performing a first etch on a dielectric layer to form an opening exposing an epitaxial (Epi) cap;
    performing a second etch on the Epi cap to reshape a top surface of the Epi cap that defines a bottom of the opening;
    forming a first metal layer over the top surface of the Epi cap, the first metal layer contacting the Epi cap and the dielectric layer; and performing an anneal operation on the first metal layer and Epi cap to form a silicide layer from a first portion of the first metal layer using silicon from the Epi cap, wherein a second portion of the first metal layer contacts an edge of the silicide layer after the anneal operation.

19. The method of claim 18, comprising:

forming a second metal layer in the opening and over the first metal layer prior to performing the anneal operation.

20. The method of claim 19, comprising:

forming a metal plug in the opening after the anneal operation, the metal plug overlying the silicide layer and the second metal layer.

* * * * *